United States Patent
Yang et al.

(10) Patent No.: US 11,444,175 B2
(45) Date of Patent: Sep. 13, 2022

(54) FABRICATION OF LONG GATE DEVICES

(71) Applicant: Taiwan Semiconductor Manufacturing Co., Ltd., Hsinchu (TW)

(72) Inventors: Sung-Hsin Yang, Hsinchu (TW); Jung-Chi Jeng, Tainan (TW); Ru-Shang Hsiao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/008,045

(22) Filed: Aug. 31, 2020

(65) Prior Publication Data
US 2022/0068719 A1 Mar. 3, 2022

(51) Int. Cl.
*H01L 29/66* (2006.01)
*H01L 21/8234* (2006.01)
*H01L 27/088* (2006.01)
*H01L 21/3213* (2006.01)

(52) U.S. Cl.
CPC .. *H01L 29/66545* (2013.01); *H01L 21/32139* (2013.01); *H01L 21/823431* (2013.01); *H01L 21/823456* (2013.01); *H01L 27/0886* (2013.01)

(58) Field of Classification Search
CPC ............... H01L 21/027; H01L 21/0274; H01L 21/0332; H01L 21/0334; H01L 21/312; H01L 21/314; H01L 21/32; H01L 21/32139; H01L 21/823431; H01L 21/823437; H01L 21/823456; H01L 21/823487; H01L 21/8238; H01L 21/823821; H01L 21/82385; H01L 27/0886; H01L 29/66477; H01L 29/66484; H01L 29/66545; H01L 29/66795; H01L 29/772; H01L 29/785; H01L 29/7855; H01L 21/31144; B82Y 10/00
See application file for complete search history.

(56) References Cited

U.S. PATENT DOCUMENTS

| 9,728,407 B2 | 7/2017 | Hsieh et al. |
| 2005/0048729 A1* | 3/2005 | Yoon ............... H01L 21/823425 438/303 |
| 2018/0374859 A1 | 12/2018 | Park et al. |
| 2020/0135728 A1 | 4/2020 | Liaw |

FOREIGN PATENT DOCUMENTS

TW 201742257 A 12/2017

* cited by examiner

*Primary Examiner* — Cheung Lee
(74) *Attorney, Agent, or Firm* — Haynes and Boone, LLP

(57) ABSTRACT

Semiconductor devices and methods of forming the same are provided. An example method includes providing a workpiece including a first dummy gate stack and a second dummy gate stack in a first area of the workpiece, a third dummy gate stack and a fourth dummy gate stack in a second area of the workpiece, a hard mask layer over each of the first dummy gate stack, the second dummy gate stack, the third dummy gate stack, and the fourth dummy gate stack. The method further includes depositing a photoresist (PR) layer over the workpiece to form a first PR layer portion over the first area and a second PR layer portion over the second area; and selectively forming a first opening through the second PR layer portion over the third dummy gate stack and a second opening through the second PR layer portion over the fourth dummy gate stack.

20 Claims, 10 Drawing Sheets

FABRICATION OF LONG GATE DEVICES

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

Development of high voltage devices, such as input/output (I/O) devices or analog-to-digital converters (ADCs), does not always track that of the core devices, such as logic devices or memory devices. For example, many high voltage devices remain planar devices while core devices have widely been implemented as multi-gate devices, such as fin-type field effect transistors (FinFETs) or gate-all-around (GAA) transistors. Replacing planar high voltage devices with multi-gate counterparts may not be intuitive. For instance, isolation structures among multi-gate high voltage devices may be needed to reliably form source/drain recesses and epitaxially grow source/drain features in the source/drain recesses. Because isolation structures may take up space, direct replacement of planar high voltage devices with multi-gate high voltage devices of comparable dimensions may not be appropriate. In addition, compared to core devices, high voltage devices have different feature sizes and insulation requirements due to their higher operating voltages. When core devices and high voltage devices are fabricated on the same workpiece or over the same fin structures, these different feature sizes may not be amenable to being formed in the same processes. Therefore, although existing high voltage devices and processes of forming the same are generally adequate for their intended purposes, they may not be satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
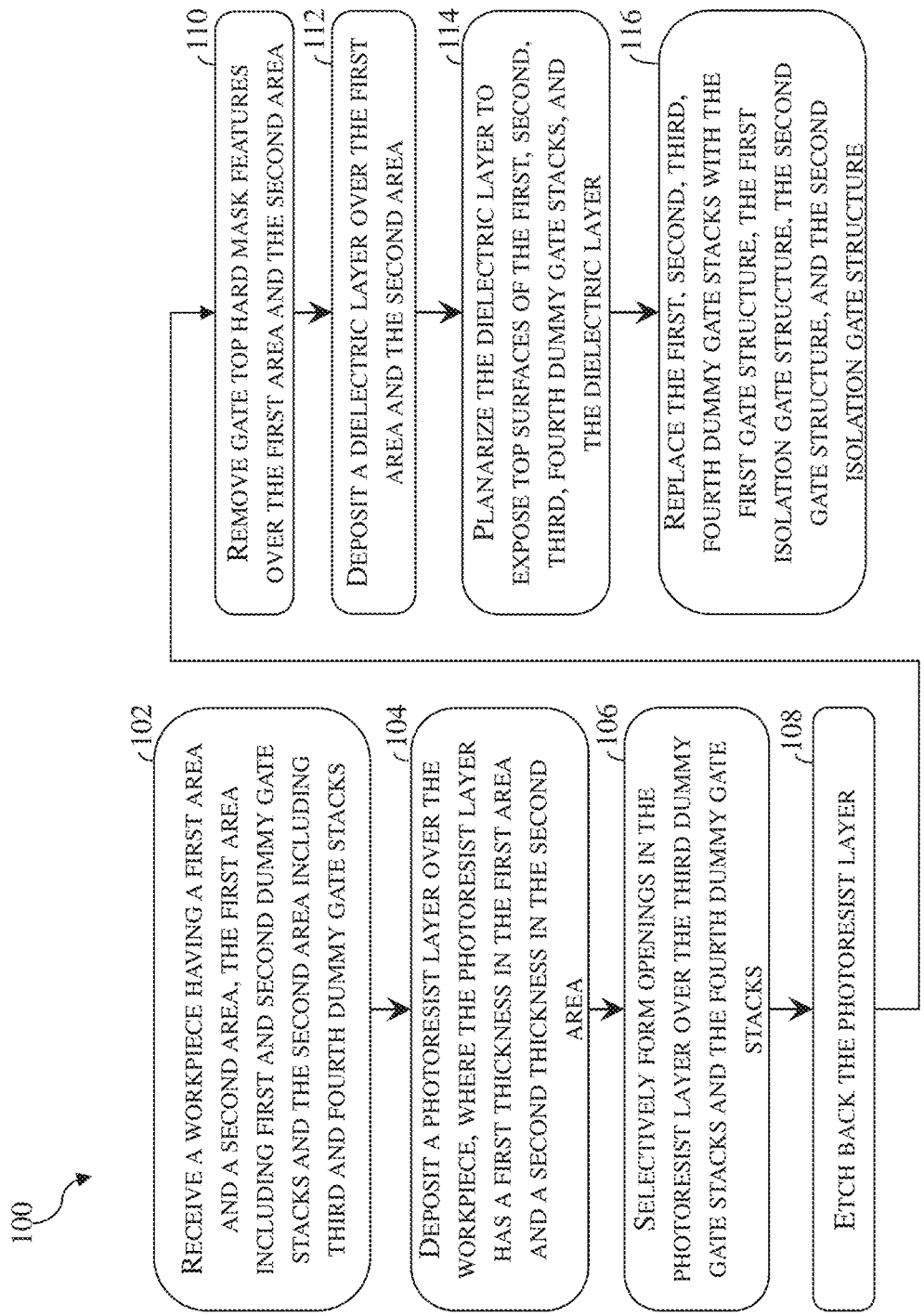
FIG. 1 is a flowchart of a method for fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Besides input/output (I/O) devices that interface between core devices and external circuitry, high voltage devices are also used in analog-to-digital converters (ADCs). For example, in the majority of CMOS image sensors, high performance ADCs are employed to convert amplified analog signals from a CMOS pixel array to digital output for further digital imaging processing. Fabrication of ADCs for a CMOS image sensor has its fair share of challenges, such as noise, gain errors and offset errors. During field application in a transistor, charge carriers (electrons or holes) travelling in the channel between a source and a drain are affected as the charge carriers get trapped and de-trapped at the interfaces with gate dielectric layers. When the gate dielectric layers have more defects, the trapping and de-trapping of charge carriers become more pronounced, resulting in fluctuation in carrier mobility. The fluctuation in carrier mobility tends to generate or increase electronic noises, such as flicker noise and random telegraph signal (RTS) noise. Flicker noise (sometimes called 1/f noise or pink noise) is a low frequency noise that may exhibit an inverse frequency power density curve. RTS noise (sometimes called burst noise, popcorn noise, impulse noise, bi-stable noise) may cause sudden changes in channel current at random and unpredictable times. Although certain measures such as thinning down the gate dielectric thickness may reduce noises, a thinner gate dielectric layer may degrade performance of a transistor, for example, in high-voltage applications. Moreover, when an ADC includes an array of high voltage transistors, these high voltage transistors may not have uniform threshold voltages. While this threshold voltage mismatch within the array is acceptable in digital applications, it may introduce gain and offset errors in the ADC's transfer function. These errors may lead to fixed-patterned noise which can be difficult to rectify.

One of the solutions to reduce noises and errors in an ADC is to increase the gate length of the transistors in the ADC. It has been observed that when the gate length (measured along the lengthwise direction of the active regions, such as fin structures) is increased to between about 0.24 μm (240 nm) and about 12 μm (12000 nm), both the noises and the errors may be greatly reduced. Considering the undesirability of large dimensions, the gate length may be between 0.24 μm (240 nm) and about 6 μm (6000 nm) for balanced performance of noise/error reduction and device dimensions. Conventionally, the transistors in an ADC are planar devices where a gate structure is disposed along one surface of an active region. Because planar devices and multi-gate devices are fabricated using different processes, fabricating planar devices and multi-gate devices on the same substrate may be complicated and costly. To improve device performance and to streamline fabrication processes, planar high voltage devices may be replaced with multi-gate counterparts. To reliably form source/drain recesses and epitaxially grow source/drain features in the source/drain recesses, isolation structures among multi-gate high voltage devices may be needed. Because isolation structures may take up space, direct replacement of planar high voltage devices with multi-gate high voltage devices of comparable dimensions may not be appropriate. In addition, compared to core devices, high voltage devices have different feature sizes and insulation requirements due to their higher operating voltages. Even when similar fabrication processes are used to form high voltage devices and core devices on the same workpiece, the difference in dimensions may create complications.

For example, when a gate replacement process is adopted, dummy gate stacks are first formed over the workpiece to undergo a portion of the fabrication processes and the dummy gate stacks are then removed and replaced by functional gate structures. To form dummy gate stacks, a semiconductor material layer is deposited over the workpiece and a gate top hard mask layer is deposited over the semiconductor material layer. Photolithography and etch processes are then used to pattern dummy gate stacks of various dimensions on the workpiece. At this point, each of the dummy gate stacks are capped by a gate top hard mask features, which is to be removed in a subsequent process. Because a high voltage device area includes long gate devices, the dummy gate stack density in the core device area may be smaller than that in the high voltage device area. It has been observed that such a dummy gate stack density difference may result in different loading in various processes. With respect to deposition processes, it has been observed that a spin-on photoresist layer on the workpiece may have a smaller thickness in the core device area and a greater thickness in the high voltage device area. This uneven photoresist layer distribution over the workpiece may lead to uneven etching of the photoresist layer in different device areas. With regards to planarization processes, such as chemical mechanical polishing (CMP) processes, dishing (i.e., a local low area) may be present on the dummy gate stacks for long gate devices (also referred to as long dummy gate stacks). Dishing on long dummy gate stacks may cause uneven removal or damages to the active regions.

The present disclosure provides methods for forming a semiconductor device that includes a core device area and a high voltage device area, which have different gate structure density due to employment of long gate devices in the high voltage device area. In some embodiments, a workpiece that includes a core device area and a high voltage device area is received. A plurality of fin structures extends over the core device area and the high voltage device area. In the core device area, first dummy gate stacks and second dummy gate stacks are disposed over at least one of the plurality of fin structures. In the high voltage device area, third dummy gate stacks and fourth dummy gate stacks are disposed over the plurality of fin structures. The first dummy gate stacks and the third dummy gate stacks will be replaced with functional gate structures. In particular, the third dummy gate stacks have a gate length between about 240 nm and about 1800 nm. When formed, each of the dummy gate stacks is capped with a gate top hard mask feature. To evenly remove the gate top hard mask features, a photoresist layer is deposited over the workpiece. Due to the increased dummy gate density, a portion of the photoresist layer in the high voltage device area is thicker than a portion of the photoresist layer in the core device area. To balance the etch loading between two device areas, openings are selectively formed in the portion of the photoresist layer over the high voltage device area but not in the portion of the photoresist layer over the core device area. According to the present disclosure, such openings are formed over each of the third dummy gate stacks and the fourth dummy gate stacks. To accommodate the openings the smaller fourth dummy gate stacks, each of the fourth dummy gate stacks of the present disclosure has a width that corresponds to a wavelength of the photolithography radiation source used to form the openings.

The various aspects of the present disclosure will now be described in more detail with reference to the figures. FIG. 1 is a flowchart of a method 100 for fabricating a semiconductor device according to various aspects of the present disclosure. Method 100 is merely an example and is not intended to limit the present disclosure to what is explicitly illustrated in method 100. Additional steps can be provided before, during, and after method 100, and some of the steps described can be moved, replaced, or eliminated for additional embodiments of method 100. Not all steps are described herein in detail for reasons of simplicity. Method 100 will be described below in conjunction with the fragmentary top views and cross-sectional views of a workpiece 200 shown in FIGS. 2-10. Because a semiconductor device will be formed from the workpiece 200, the workpiece 200 may be referred to as semiconductor device 200 as the context requires. As will be described in more details below, the workpiece 200 includes a first device area 10 and a second device area 20. In each of FIGS. 2-10, the first device area 10 of the workpiece 200 is shown in part (A) and the second device area 20 of the workpiece 200 is shown in part (B).

In some implementations, the semiconductor device 200 is one that includes low-voltage digital functionalities in the first device area 10 and high-voltage functionalities in the second device area 20. An example of the semiconductor device 200 is an ADC that is configured to convert analog signals from an analog signal source, such as a CMOS pixel array, to digital output for further digital signal processing. In this example, the first device area 10 of the semiconductor device 200 is a digital area or a core device area while the second device area 20 of the semiconductor device 200 is an analog area or a high voltage device area. In terms of gate lengths, the semiconductor device 200 of the present disclosure includes long gate devices in the second device area 20 while the first device area 10 is free of long gate devices.

Figure 2:
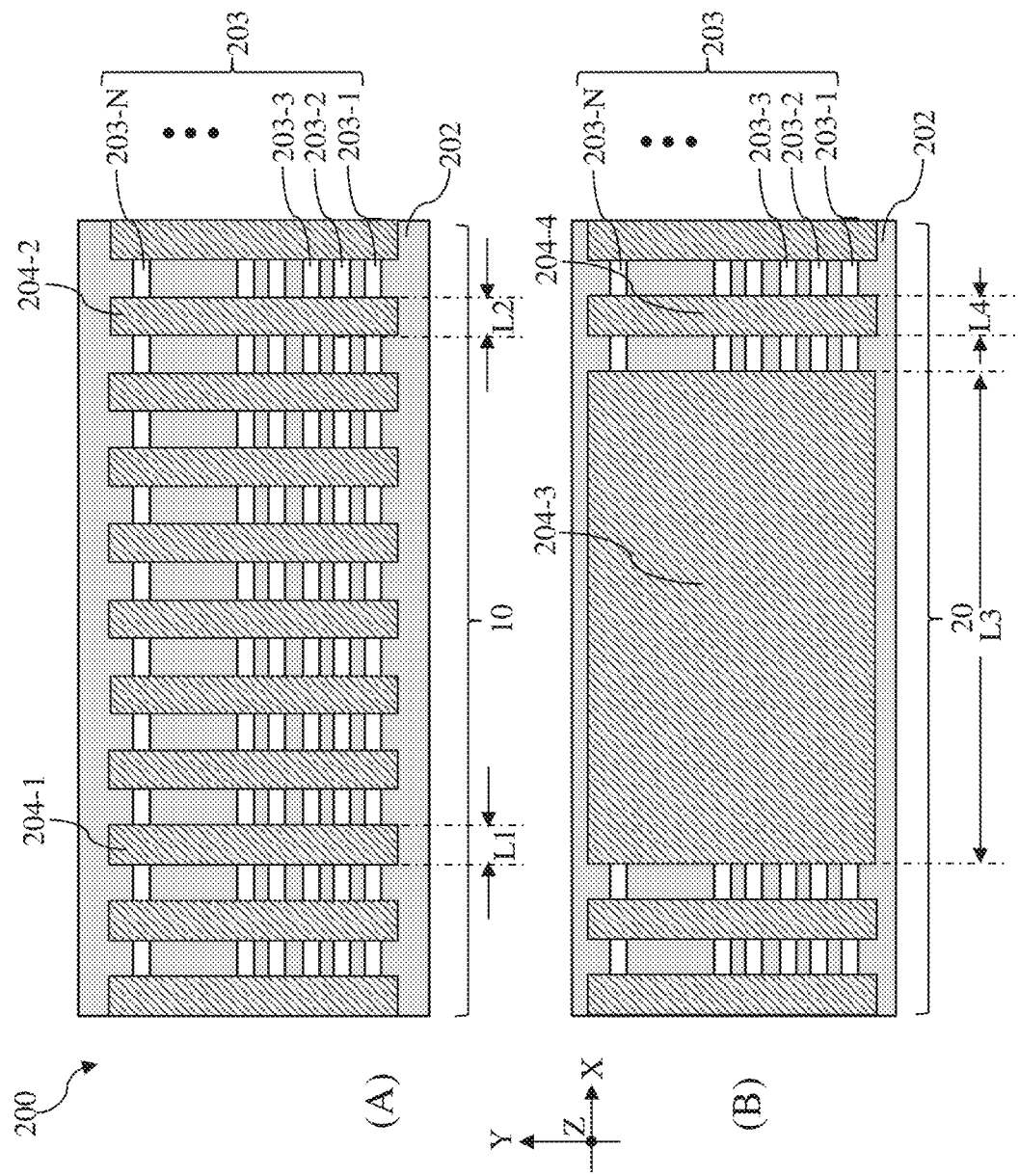
FIG. 2 is a fragmentary top view of a workpiece during a fabrication stage, such as one associated with the method in FIG. 1, according to various aspects of the present disclosure.
Figure 3:
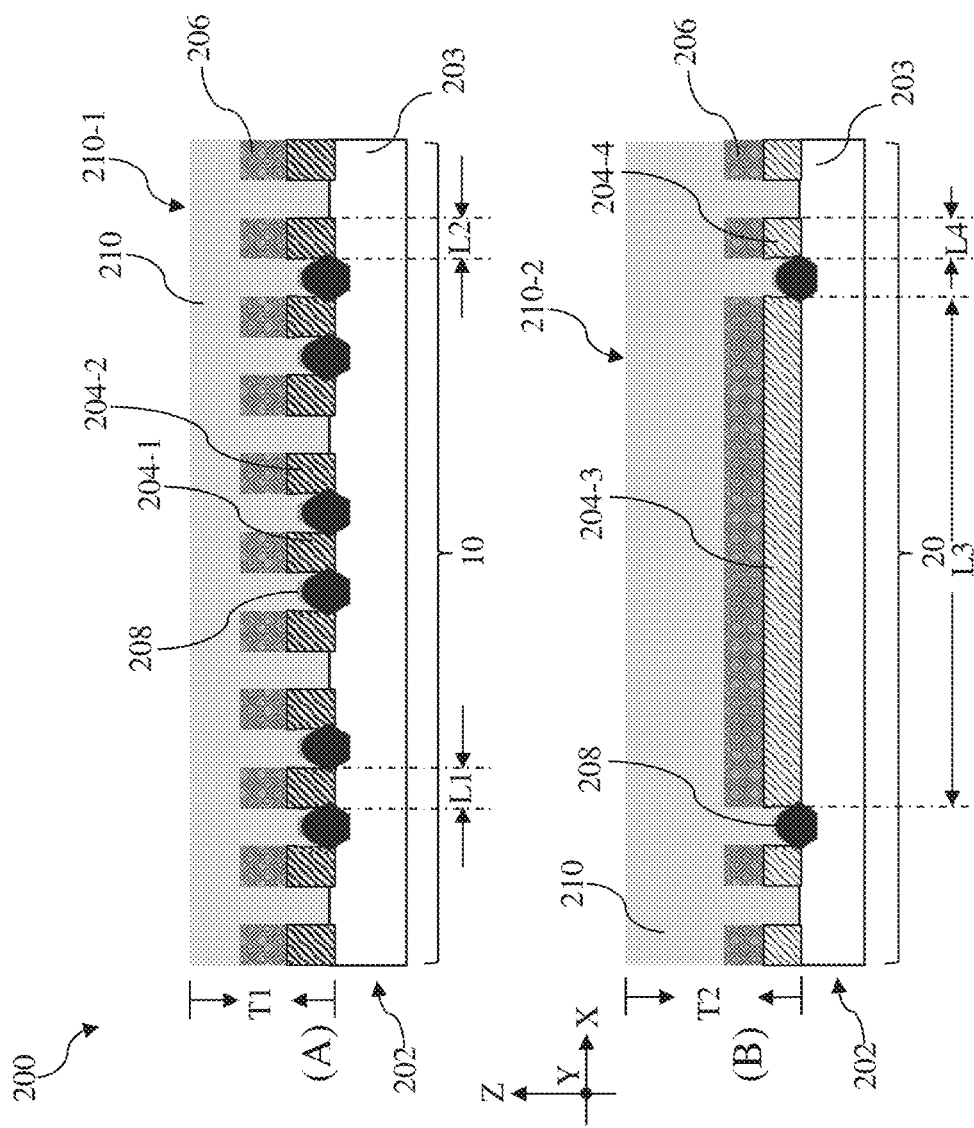
FIGS. 3 through 10 are fragmentary cross-sectional views of a workpiece at various fabrication stages, such as those associated with the method in FIG. 1, according to various aspects of the present disclosure.

Referring to FIGS. 1, 2 and 3, method 100 includes a block 102 where a workpiece 200 is received. As shown in FIG. 2, the workpiece 200 includes a plurality of fin structures 203 that arise from a substrate 202 and expand over the first device area 10 and the second device area 20 of the workpiece 200. In the first device area 10, first dummy gate stacks 204-1 and second dummy gate stacks 204-2 are formed over the plurality of fin structures 203. In the second device area 20, third dummy gate stacks 204-3 and fourth dummy gate stacks 204-4 are formed over the plurality of fin structures 203. Referring to FIG. 3, source/drain features 208 are disposed adjacent both ends of the first dummy gate stacks 204-1 and the third dummy gate stacks 204-3 along the X direction. It is noted that the source/drain features 208 are omitted from FIG. 2 for simplicity.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof. In some embodiments where the substrate 202 includes FETs, various doped regions, such as source/drain regions, are disposed in or on the substrate 202. The doped regions may be doped with p-type dopants, such as phosphorus or arsenic, and/or n-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The plurality of fin structures 203 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the plurality of fin structures 203 on the substrate 202. The etching process may include dry etching, wet etching, reactive ion etching (RIE), and/or other suitable processes. Numerous other embodiments of methods for forming the plurality of fin structures 203 may be suitable. For example, the plurality of fin structures 203 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the plurality of fin structures 203. In some embodiments, the photolithography radiation source for forming the plurality of fin structures 203 may be an extreme ultraviolet (EUV) radiation source, or an argon fluoride excimer laser radiation source with a wavelength at 193 nm. In some implementations, immersion lithography techniques may be used to form the plurality of fin structures 203. The plurality of fin structure 203 may include N fin structures, where N is between 2 and 80.

While not explicitly shown in FIGS. 2 and 3, the plurality of fin structures 203 may be separated from one another by an isolation feature may include silicon oxide, silicon nitride, silicon oxynitride, fluoride-doped silicate glass (FSG), a low-k dielectric material, and/or other suitable materials. The isolation feature may include shallow trench isolation (STI) features. In one embodiment, the isolation feature may be formed by etching trenches in the substrate 202 during the formation of the plurality of fin structures 203. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation feature. Alternatively, the isolation feature may include a multi-layer structure, for example, having one or more thermal oxide liner layers. The isolation feature may be deposited by any suitable method, such as chemical vapor deposition (CVD), flowable CVD (FCVD), spin-on-glass (SOG), other suitable methods, or combinations thereof.

A gate-last or gate replacement process is incorporated into methods of the present disclosure. In a gate-last process, a dummy gate stack is formed earlier in the fabrication process to serve as a placeholder to endure some gate-damaging process steps and is later replaced with a functional gate structure. Formation of the dummy gate stacks includes deposition of a semiconductor material layer over the workpiece 200 and deposition of a gate top hard mask layer 206 over the semiconductor material layer. In some instances, the semiconductor material layer may include polysilicon. The gate top hard mask layer 206 may be a single layer or a multi-layer. In an example, the gate top hard mask layer 206 may include a first hard mask layer over the semiconductor material layer and a second hard mask layer over the first hard mask layer. The first hard mask layer may include silicon nitride or silicon carbonitride. The second hard mask layer may include silicon oxide. Photolithography and etch processes are used to pattern the gate top hard mask layer. For example, a photoresist layer is deposited over the gate top hard mask layer 206, exposed to radiation transmitting through or reflected from a mask, baked in a post-exposure bake process, and developed in a developer solution to form a patterned photoresist layer. The patterned photoresist layer is applied as an etch mask to pattern the gate top hard mask layer. Then the patterned gate top hard mask layer 206 is used as an etch mask to pattern the semiconductor material layer into the first dummy gate stacks 204-1, the second dummy gate stacks 204-2, the third dummy gate stacks 204-3, and the fourth dummy gate stacks 204-4. Referring still to FIG. 3, gate top hard mask features remain on top of each of the dummy gate stacks. For ease of reference, these gate top hard mask features are also referred to as gate top hard mask features 206.

Figure 10:
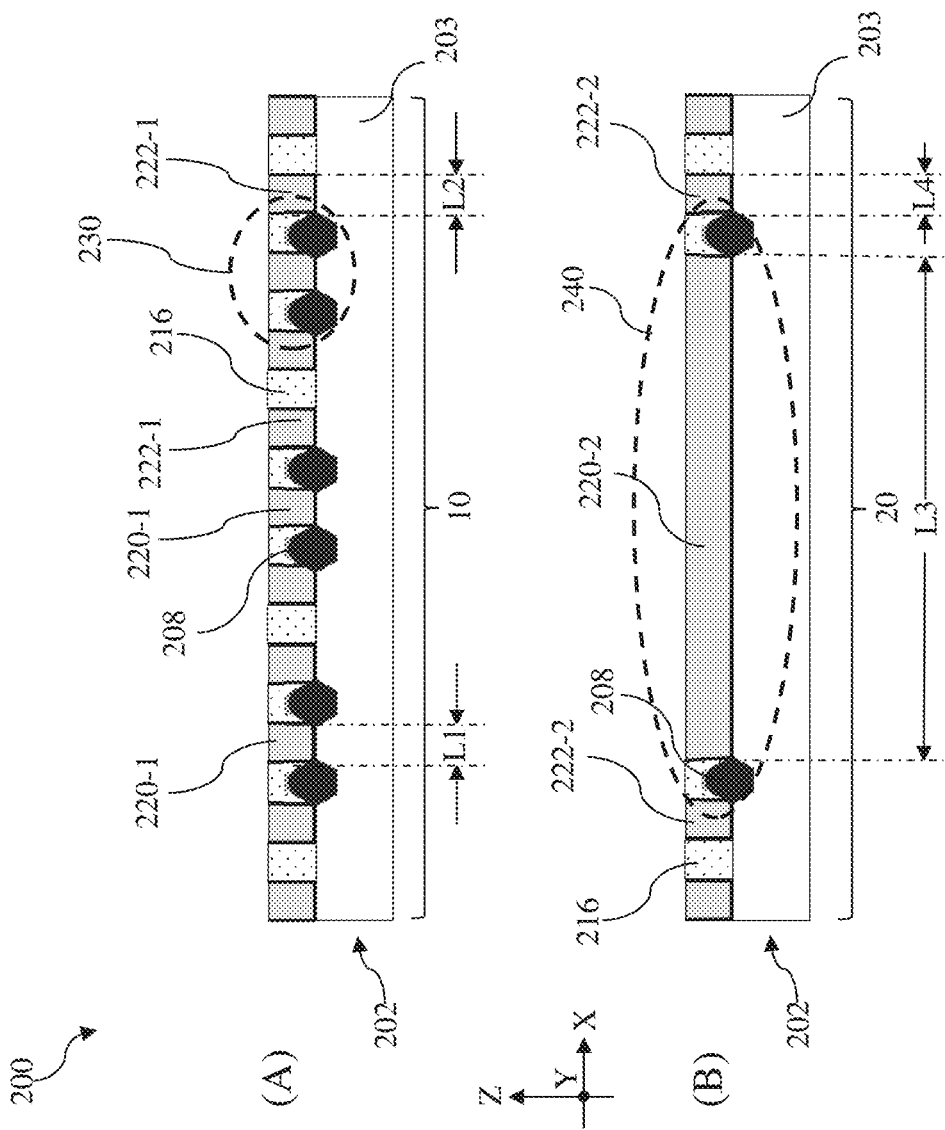

The first dummy gate stacks 204-1, the second dummy gate stacks 204-2, the third dummy gate stacks 204-3, and the fourth dummy gate stacks 204-4 have different gate lengths along the X direction. The gate lengths of the dummy gate stacks generally correspond to the gate lengths of the gate structures. To illustrate, reference is briefly made to FIG. 10. In FIG. 10, the first dummy gate stack 204-1 is replaced with a first gate structure 220-1, the second dummy gate stack 204-2 is replaced with a first isolation gate structure 222-1, the third dummy gate stack 204-3 is replaced with a second gate structure 220-2, and the fourth dummy gate stack 204-4 is replaced with a second isolation gate structure 222-2. As shown in FIGS. 2 and 3, each of the first dummy gate stacks 204-1 has a first gate length L1, each of the second dummy gate stacks 204-2 has a second gate length L2, each of the third dummy gate stacks 204-3 has a third gate length L3, and each of the fourth dummy gate stacks 204-4 has a fourth gate length L4. The gate structures and isolation gate structures replacing the respectively dummy gate stacks have corresponding gate lengths. For example, the first gate structure 220-1 may assume the first gate length L1, the second gate structure 220-2 may assume the third gate length L3, the first isolation gate structure 222-1 may assume the second gate length L2, and the second isolation gate structure 222-2 may assume the fourth gate length L4. In some implementations, the first gate length L1 is between about 8 nm and 33 nm, the second gate length L2 is between about 10 nm and about 45 nm, the third gate length L3 is between about 240 nm and about 6000 nm, and the fourth gate length L4 is between about 100 nm and about 320 nm. For avoidance of doubts, the first gate structure 220-1 and the second gate structure 220-2 are functional gate structures. The first isolation gate structure 222-1 and the second isolation gate structure 222-2 are isolation gate structures that functions to define and restrict source/drain features 208.

Referring to FIGS. 1 and 3, method 100 includes a block 104 where a photoresist (PR) layer 210 (also referred to as a PR layer 210) is deposited over the workpiece 200. As shown in FIG. 3, the photoresist (PR) layer 210 includes a first portion 210-1 (also referred to a first PR portion 210-1) over the first device area 10 and a second portion 210-2 (also referred to a second PR portion 210-2) over the second device area 20. In some embodiments, the long gate length of the third dummy gate stack 204-3 in the second device area 20 leads to a greater dummy gate density in the second device area 20. Similarly, the lack of long gate devices in the first device area 10 reduces the dummy gate density. It has been observed that the dummy gate density or presence of inter-dummy-gate trenches are tied to thicknesses of the first portion 210-1 of the photoresist (PR) layer 210 and the second portion 210-2 in the photoresist (PR) layer 210. In embodiments illustrated in FIG. 3, the first portion 210-1 has a first thickness (T1) between about 2500 Å and about 2700 Å and the second portion 210-2 has a second thickness (T2) between about 2600 Å and about 3000 Å. The second thickness (T2) is greater than the first thickness (T1). In some instances, a difference between the first thickness (T1) and the second thickness (T2) is between about 100 Å and about 300 Å. Without any intervening process steps, such as those at block 106, this thickness difference may result in photoresist layer residue over some gate top hard mask features 206 in the second device area 20. The residual photoresist layer may further lead to incomplete removal of the gate top hard mask features 206, incomplete removal of third dummy gate stacks 204-3 and the fourth dummy gate stacks 204-4, and incomplete or defective formation of gate structures. Resorting directly to planarization processes may not be an ideal solution as the long third dummy gate stacks 204-3 may induce dishing during CMP, which may nevertheless lead to defective gate structures.

Figure 4:
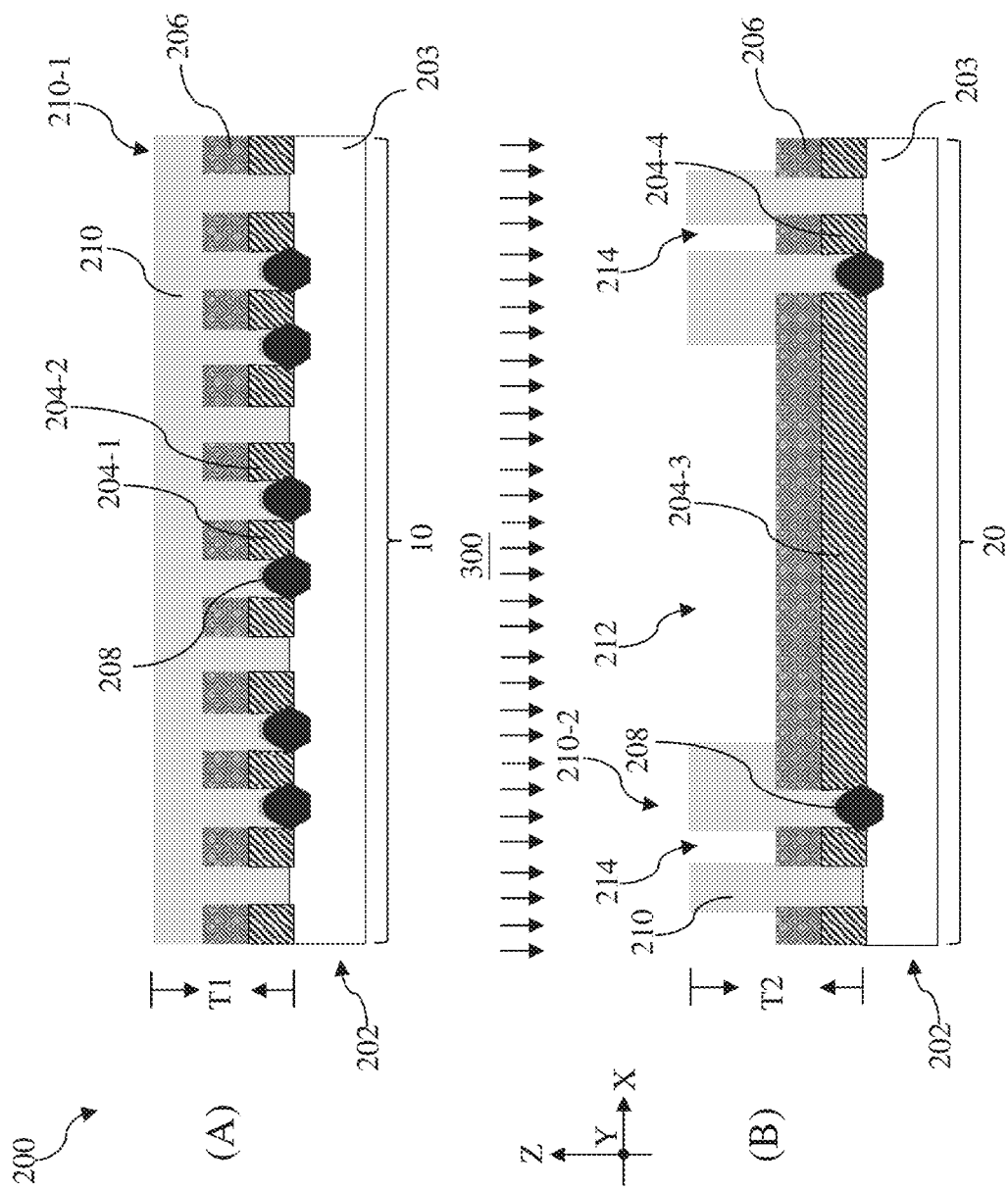

Referring to FIGS. 1 and 4, method 100 include a block 106 where first openings 212 and second openings 214 in the photoresist (PR) layer 210 over the third dummy gate stacks 204-3 and the fourth dummy gate stacks 204-4 are selectively formed. To balance out of the difference between the first thickness (T1) of the first portion 210-1 and the second thickness (T2) of the second portion 210-2, openings are formed in the second portion 210-2 while the first portion 210-1 is kept intact. That is, the first openings 212 and the second openings 214 are only formed in the second portion 210-2 of the photoresist (PR) layer 210. Experimental results indicate that to ensure even etch back of the gate top hard mask features 206 in the first device area 10 and the second device area 20, each of the third dummy gate stack 204-3 and the fourth dummy gate stack 204-4 may correspond to an opening. In embodiments represented in FIG. 4, one first opening 212 is disposed over each of the third dummy gate stacks 204-3 and one second opening 214 is disposed over each of the fourth dummy gate stacks 204-4. The X-direction dimension of the first opening 212 is smaller than the third gate length L3 and the X-direction dimension of the second opening 214 is smaller than the fourth gate length L4. In some implementations, the X-direction dimension of the first opening 212 is between about 50% and about 90% of the third gate length L3; and the X-direction dimension of the second opening 214 is between about 50% and about 90% of the fourth gate length L4.

In some embodiments, a photolithography process 300 may be used to pattern the second portion 210-2 to form the first openings 212 and the second openings 214. At this stage, because photolithography of the fin structures 203 and the dummy gate stacks have already been performed, the photolithography process 300 may be a different type of photolithography process with a reduced resolution. Put differently, the photolithography process 300 may involve use of a radiation source having a wavelength greater than the wavelength of the radiation source used to form the fin structures 203 and the dummy gate stacks. For example, the radiation source for the photolithography process 300 may be a krypton fluoride (KrF) excimer laser radiation source, which has a wavelength at about 248 nm. As compared to an EUV radiation source, an ArF radiation source, or an ArF radiation source with immersion technology, the photolithography process 300 with a KrF radiation source is much more economical.

To ensure that the X-direction dimension of the second opening 214 is smaller than fourth gate length L4 of the fourth dummy gate stack 204-4, the fourth gate length L4 should be substantially equal to or greater than the wavelength of the radiation source for the photolithography process 300. In embodiments where the wavelength of the radiation source for the photolithography process 300 is 248 nm, the fourth gate length L4 should be around 248 nm or greater. However, this does not mean the fourth gate length L4 should be much greater than 248 nm. As described above, the fourth dummy gate stack 204-4 is to be replaced with the second isolation gate structure 222-2 (shown in FIG. 10). That is, when the fourth gate length L4 that serves only isolation functions is unduly large, precious space may be wasted. Experimental and simulation results show that when the fourth gate length L4 is between about 100 nm and about 150 nm, the resulting second isolation gate structure 222-2 would serve the requisite isolation function properly. In consideration of the resolution limit of the photolithography process 300, preference for high device density, and sufficiency of isolation, the fourth gate length L4 may be substantially equal to 248 nm, such as between about 240 nm and about 260 nm.

Figure 5:
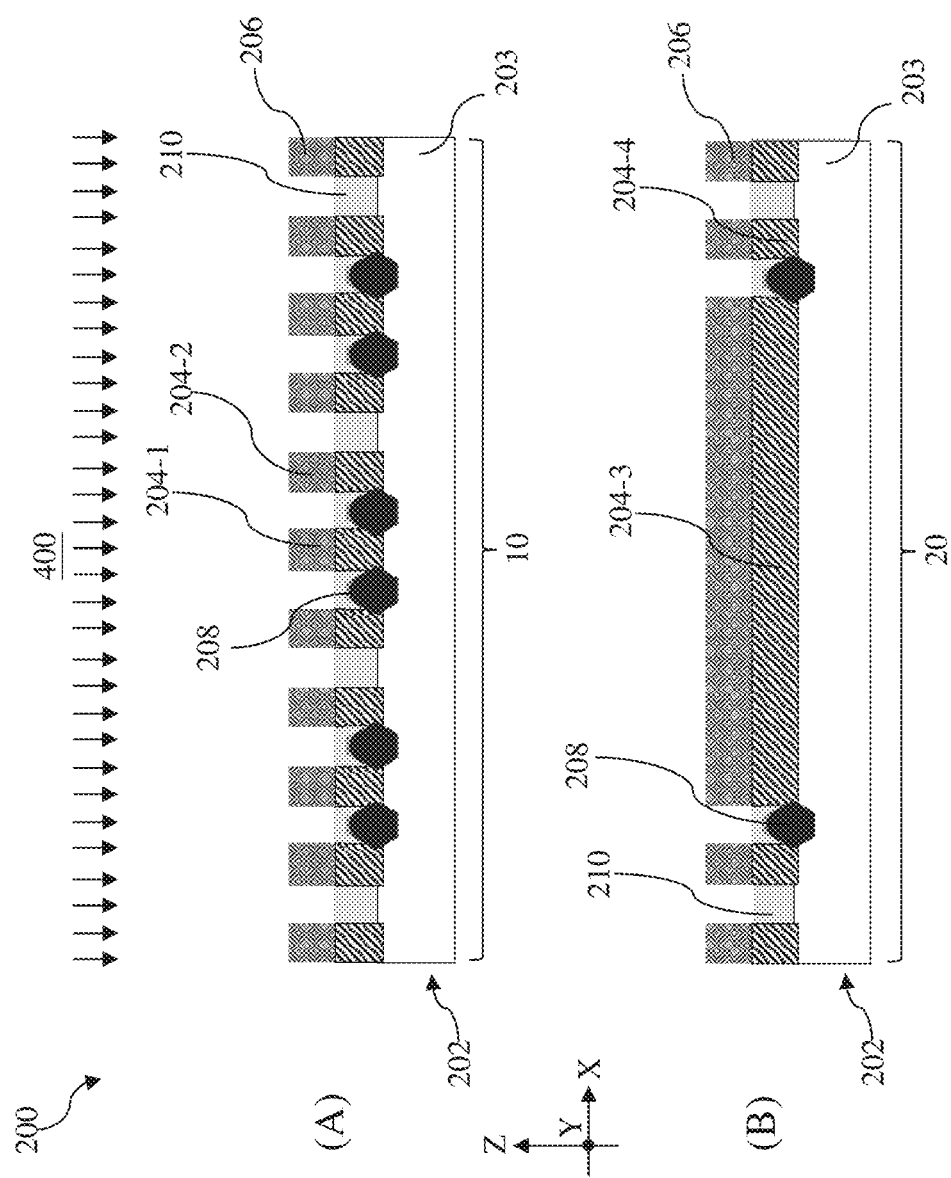

Referring to FIGS. 1 and 5, method 100 includes a block 108 where the photoresist (PR) layer 210 is etched back. In some embodiments, an etch back process 400 may be performed at block 108. The etch back process 400 may be selective to the photoresist (PR) layer 210 such that the etch back process 400 does not substantially etch the gate top hard mask features 206. In some embodiments, the etch back process 400 may a dry etch process, a wet etch process, or a suitable etch process. In some implementations, the etch back process 400 is time-controlled such that, upon conclusion of block 108, a top surface of the photoresist (PR) layer 210 is substantially level with a top surface of the dummy gate stacks on the workpiece 200. The residual photoresist (PR) layer 210 may protect the fin structures and the source/drain features 208 during operations at block 110.

Figure 6:
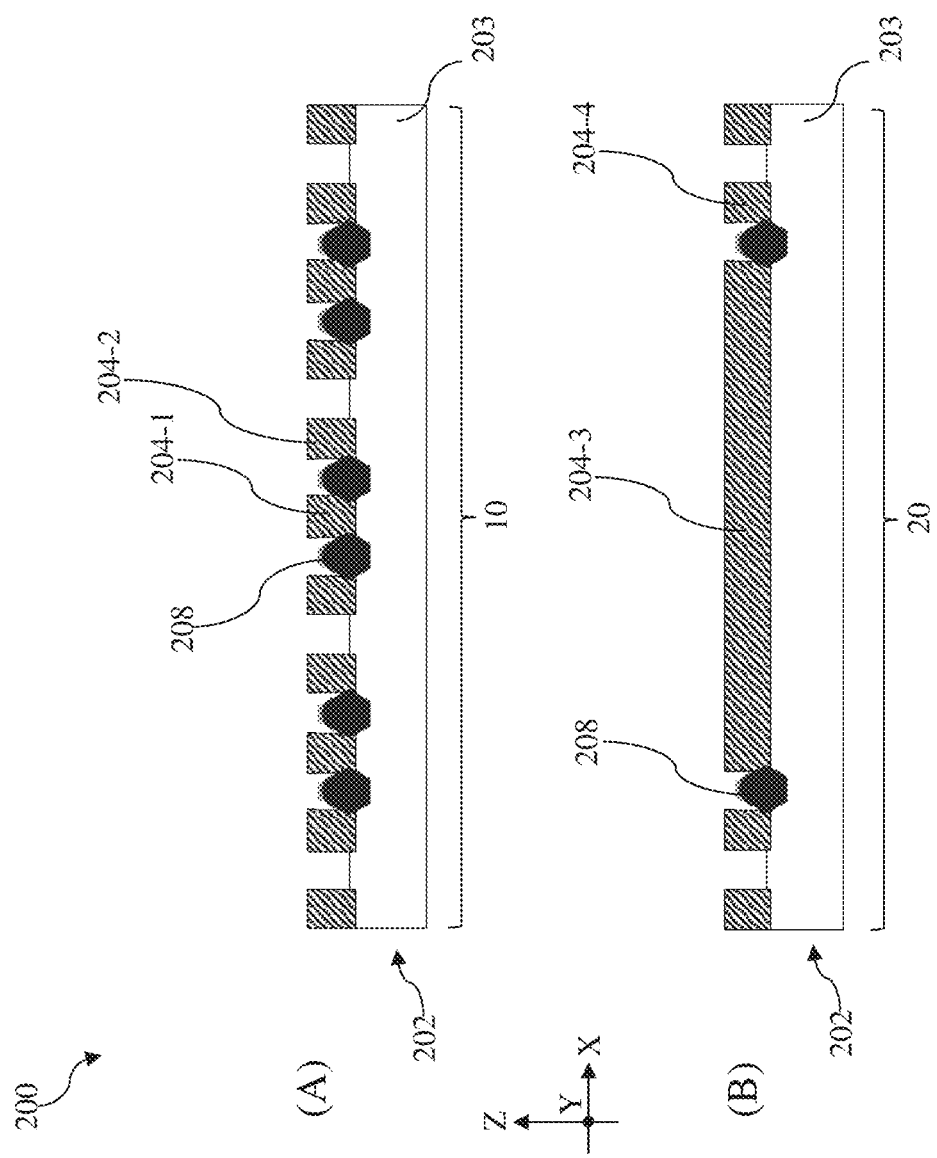

Referring to FIGS. 1 and 6, method 100 includes a block 110 where the gate top hard mask features 206 over the first device area 10 and the second device area 20 is removed. In some embodiments, an etch process that is selective to the gate top hard mask features 206 is performed at block 110. The etch process may be a dry etch process, a wet etch process, or a suitable etch process. As shown in FIG. 6, the gate top hard mask features 206 are completely removed from the first device area 10 and the second device area 20 of the workpiece 200.

Figure 7:
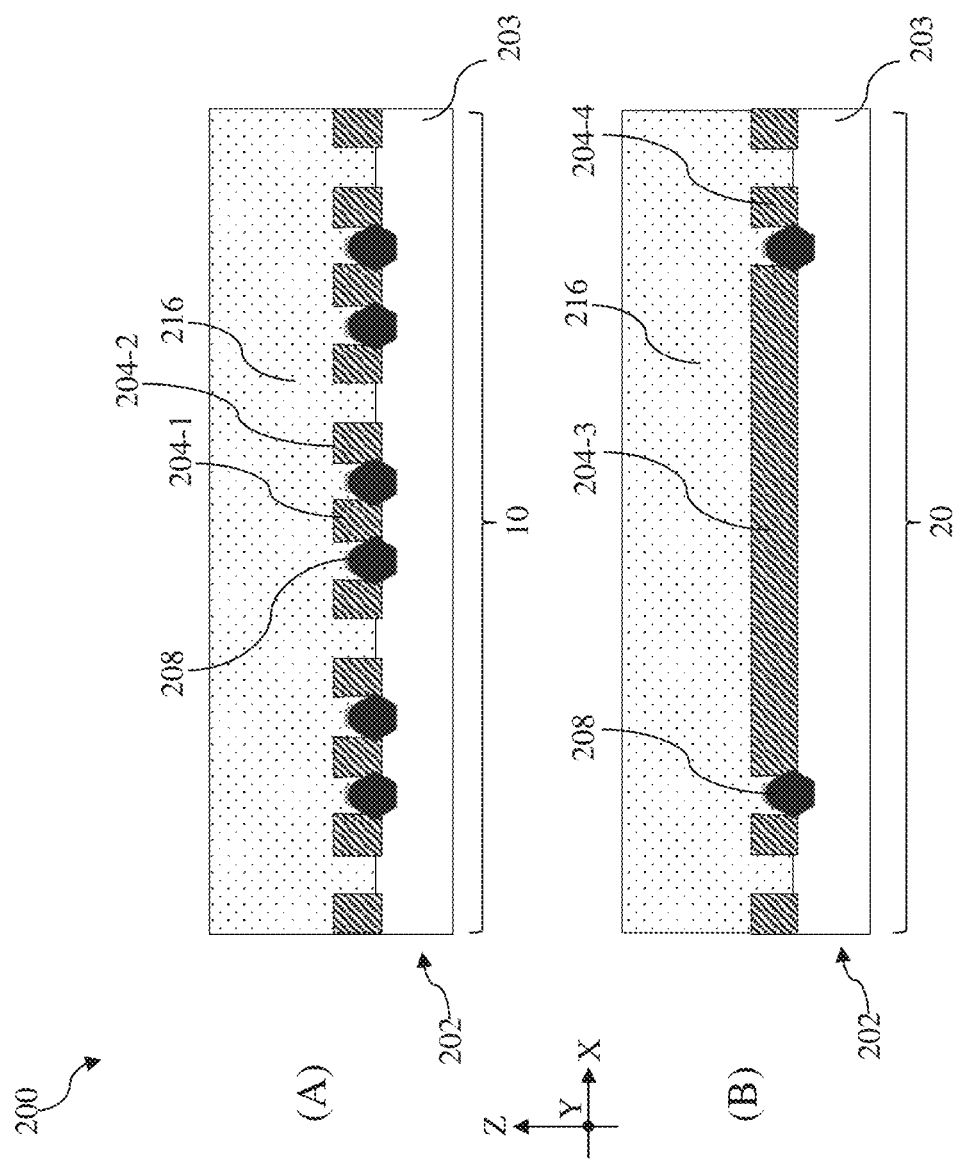

Referring to FIGS. 1 and 7, method 100 includes a block 112 where a dielectric layer 216 is deposited over the workpiece 200. The dielectric layer 216 may include a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the dielectric layer 216 includes an oxide-containing dielectric material. The dielectric layer 216 may be formed by a deposition process such as, for example, CVD, flowable CVD (FCVD), spin-on-glass (SOG), other suitable methods, or combinations thereof. The dielectric layer 216 may be referred to as an interlayer dielectric (ILD) layer 216.

Figure 8:
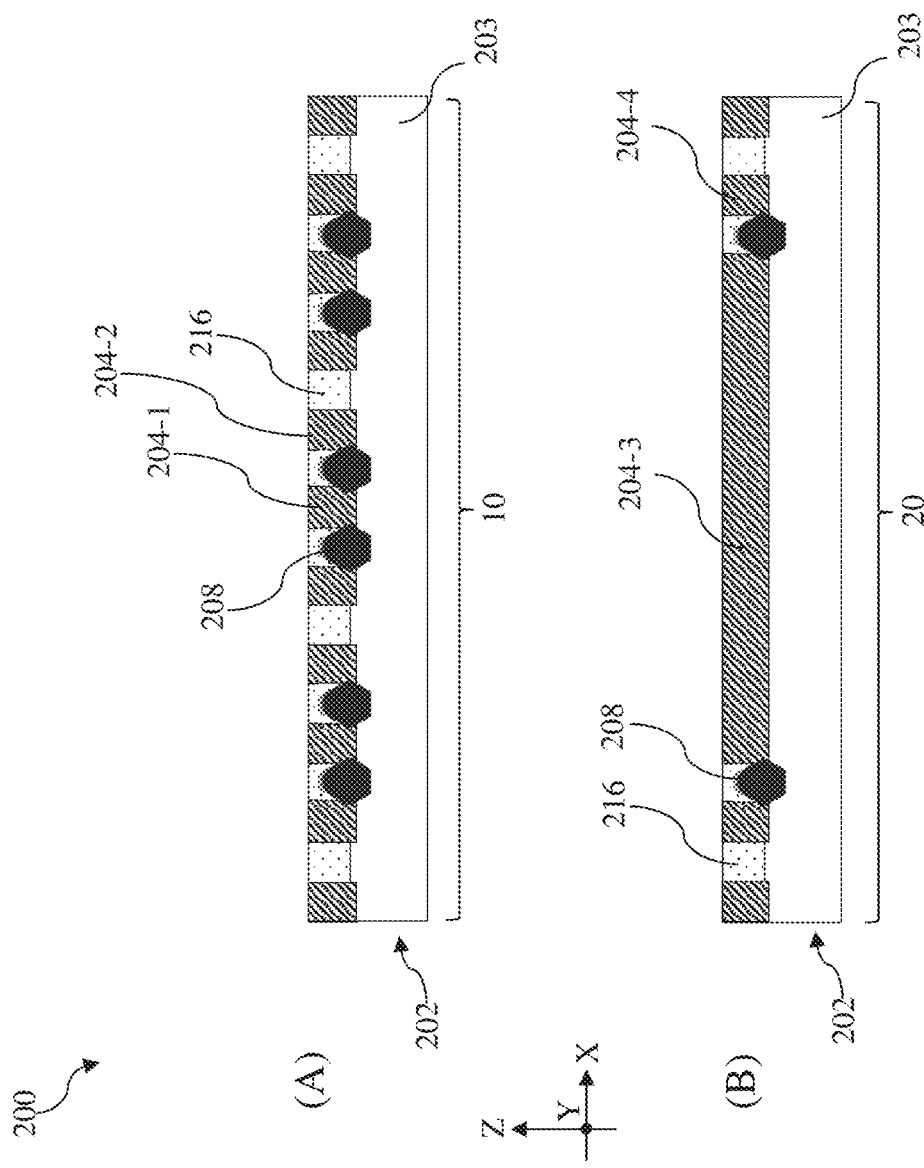

Referring to FIGS. 1 and 8, method 100 includes a block 114 where the dielectric layer 216 is planarized to expose top surfaces of the first dummy gate stacks 204-1, the second dummy gate stacks 204-2, the third dummy gate stacks 204-3, and the fourth dummy gate stacks 204-4. At block 114, a planarization process, such as a CMP process, may be performed to remove the portion of the ILD layer 216 over the first dummy gate stacks 204-1, the second dummy gate stacks 204-2, the third dummy gate stacks 204-3, and the fourth dummy gate stacks 204-4, thereby exposing their top surfaces. As shown in FIG. 8, upon conclusion of block 114, the top surfaces of the first dummy gate stacks 204-1, the second dummy gate stacks 204-2, the third dummy gate stacks 204-3, the fourth dummy gate stacks 204-4, and the ILD layer 216 are coplanar or substantially coplanar.

Figure 9:
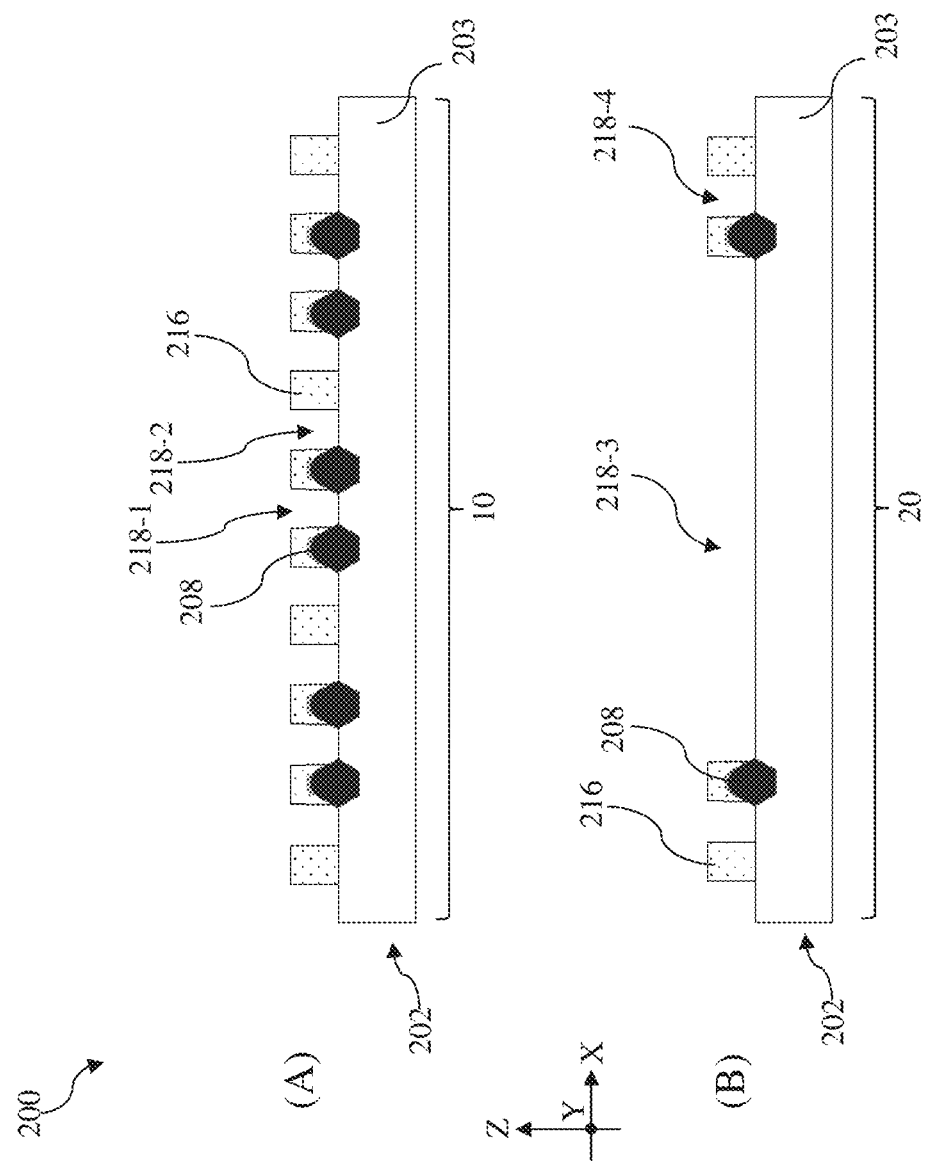

Referring to FIGS. 1, 9 and 10, method 100 includes a block 116 where the first dummy gate stacks 204-1, the second dummy gate stacks 204-2, the third dummy gate stacks 204-3, and the fourth dummy gate stacks 204-4 are replaced with a first gate structure 220-1, a first isolation gate structure 222-1, a second gate structure 220-2, and a second isolation gate structure 222-2. Referring to FIG. 9, in some embodiments, the dummy gate stacks 204 (including the first dummy gate stacks 204-1, the second dummy gate stacks 204-2, the third dummy gate stacks 204-3, and the fourth dummy gate stacks 204-4) serve as placeholders for the functional gate structures 220 (including the first gate structure 220-1 and the second gate structure 220-2) and the isolation gate structures 222 (including the first isolation gate structure 222-1 and the second isolation gate structure 222-2) and is selectively etched away at block 116. In instances where the dummy gate stacks 204 includes polysilicon, an etch process that is selective to polysilicon may be used to remove the dummy gate stacks 204 to form gate trenches where the channel regions in the plurality of fin structures 203 are exposed.

While not explicitly shown, each of the gate structures 220 and the isolation gate structures 222 may include a gate dielectric layer and a gate electrode. The gate dielectric layer may include an interfacial layer on the channel region of the fin structure 203 and one or more high-k dielectric layers (i.e., having a dielectric constant greater than that of silicon oxide, which is about 3.9) over the interfacial layer. In some implementations, the interfacial layer may include silicon oxide and the high-k dielectric layer may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. The interfacial layer functions to enhance adhesion of the high-k dielectric layers to the channel region of the fin structure 203. The gate electrode may include at least one work function metal layer and a metal fill layer disposed thereover. Depending on the conductivity type of the semiconductor device 200, the work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The metal fill layer may include copper (Cu), tungsten (W), aluminum (Al), cobalt (Co), other suitable materials, or combinations thereof and may be deposited using physical vapor deposition (PVD), CVD, ALD, or other suitable processes. As illustrated in FIG. 10, a planarization process may be performed to the workpiece 200 to form a planar top surface.

Reference is made to FIG. 10. The semiconductor device 200 may include a first transistor 230 in the first device area 10 and a second transistor 240 in the second device area 20. Each of the first transistors 230 is spaced apart along the X direction from a neighboring first transistor 230 by at least one of the first isolation gate structures 222-1. In some embodiments, each of the first transistors 230 is spaced apart along the X direction from a neighboring first transistor 230 by two of the first isolation gate structures 222-1. Each of the second transistors 240 is spaced apart along the X direction from a neighboring second transistor 240 by at least one of the second isolation gate structures 222-2. In some embodiments, each of the second transistors 240 is spaced apart along the X direction from a neighboring second transistor 240 by two of the second isolation gate structures 222-2. As described above, in embodiments where the semiconductor device 200 is an analog-to-digital converter (ADC), the first device area 10 is a digital area and the second device area 20 is an analog area. In these embodiments, the first transistor 230 has an operating voltage between about 0.5 V and about 0.8 V and the second transistor 240 has an operating voltage between about 1.8 V and about 4 V, such as between about 2.5 V and about 3.3 V. In some implementations, the first gate length L1 of the first transistor 230 is between about 8 nm and 33 nm, and the third gate length L3 of the second transistor 240 is between about 240 nm and about 6000 nm. The second transistor 240 in the second device area 20 is a long-gate device. The fourth gate length L4 of the second isolation gate structure 222-2 may be between about 100 nm and about 320 nm. In embodiments where the openings formed at block 106 involves use of a KrF radiation source with a wavelength of 248 nm, the fourth gate length L4 may be between about 240 nm and about 260 nm.

Methods of the present disclosure provide benefits. In high voltage or ADC applications, a single device may be fabricated on a workpiece having a first device area and a second device area where long gate devices for high voltage applications are disposed in the second device area. According to some embodiments of the present disclosure, a photoresist layer is deposited over dummy gate stacks, each of which is capped by a gate top hard mask feature. Because of the different dummy gate stack densities in the first and second device areas, the photoresist layer may be thicker in the second device area and thinner in the first device area. To balance out uneven photoresist layer thickness, openings in the photoresist layer are selectively formed over each of the dummy gate stacks in the second device area. These openings allow even etch back of photoresist layer across the workpiece, which in turn leads to uniform removal of the gate top hard mask features. In implementations where the openings are formed using a radiation source, the dummy gate stacks in the second device area may have a dimension that bears a relationship with the wavelength of that radiation source. Methods of the present disclosure allow improved process windows for fabrication of devices of different gate lengths.

The present disclosure provides for many different embodiments. In one embodiment, a method is provided. The method includes providing a workpiece that includes a first dummy gate stack and a second dummy gate stack disposed in a first area of the workpiece, a first source/drain feature disposed between the first dummy gate stack and the second dummy gate stack, a third dummy gate stack and a fourth dummy gate stack disposed in a second area of the workpiece, a second source/drain feature disposed between the third dummy gate stack and the fourth dummy gate stack, a hard mask layer disposed over each of the first dummy gate stack, the second dummy gate stack, the third dummy gate stack, and the fourth dummy gate stack. The method further includes depositing a photoresist (PR) layer over the workpiece to form a first PR layer portion over the first area and a second PR layer portion over the second area, and selectively forming a first opening through the second PR layer portion over the third dummy gate stack and a second opening through the second PR layer portion over the fourth dummy gate stack. The first dummy gate stack, the second dummy gate stack, the third dummy gate stack, and the fourth dummy gate stack include polysilicon.

In some embodiments, the first PR layer portion includes a first thickness and the second PR layer portion includes a second thickness greater than the first thickness. In some implementations, a difference between a thickness of the first PR layer portion and a thickness of the second PR layer portion is between about 100 Å and about 300 Å. In some embodiments, a first width of the first dummy gate stack is substantially equal to a second width of the second dummy gate stack and a third width of the third dummy gate stack is between about 240 nm and 1800 nm. In some instances, the selectively forming of the first opening and the second opening includes use of a lithography radiation source and a fourth width of the fourth dummy gate stack is substantially equal to a wavelength of the lithography radiation source. In some embodiments, the wavelength is about 248 nm. In some implementations, the method may further include etching back the first PR layer portion and the second PR layer portion, removing the hard mask layer, depositing a dielectric layer over the workpiece, planarizing the workpiece such that top surfaces of the first dummy gate stack, the second dummy gate stack, the third dummy gate stack, and the fourth dummy gate stack, and the dielectric layer are coplanar, and replacing the first dummy gate stack, the second dummy gate stack, the third dummy gate stack, and the fourth dummy gate stack with a first gate structure, a first isolation gate structure, a second gate structure, and a second isolation gate structure, respectively.

In another embodiment, a method is provided. The method includes providing a workpiece that includes a plurality of fin structures extending along a first direction over a first area and a second area of the workpiece, a plurality of first dummy gate stacks and a plurality of second dummy gate stacks disposed in the first area, a plurality of third dummy gate stack and a plurality of fourth dummy gate stacks disposed in the second area, a hard mask layer disposed over each of the plurality of first dummy gate stacks, the plurality of second dummy gate stacks, the plurality of third dummy gate stacks, and the plurality of fourth dummy gate stacks. The method further includes depositing a photoresist (PR) layer over the workpiece to form a first PR layer portion over the first area and a second PR layer portion over the second area, and selectively forming a plurality of first openings through the second PR layer portion over the plurality of third dummy gate stack and a plurality of second openings through the second PR layer portion over the plurality of fourth dummy gate stacks, while the first PR layer portion remains intact. In some instances, the plurality of first dummy gate stacks and the plurality of second dummy gate stacks include a first dummy gate stack density and the plurality of third dummy gate stacks and the plurality of fourth dummy gate stack include a second dummy gate stack density greater than the first dummy gate stack density. In some implementations, the first PR layer portion includes a first thickness and the second PR layer portion includes a second thickness greater than the first thickness. In some instances, a difference between the first thickness and the second thickness is between about 100 Å and about 300 Å. In some embodiments, the plurality of first dummy gate stacks are spaced apart from one another by at least one of the plurality of second dummy gate stacks and the plurality of third dummy gate stacks are spaced apart from one another by at least one of the plurality of fourth dummy gate stacks. In some implementations, a first width of each of the plurality of third dummy gate stacks is between about 240 nm and 1800 nm, the selectively forming of the plurality of first openings and the plurality of second openings includes use of a lithography radiation source, and a second width of the each of the plurality of fourth dummy gate stacks is substantially equal to a wavelength of the lithography radiation source. In some embodiments, the wavelength is about 248 nm. In some implementations, the method may further include etching back the first PR layer portion and the second PR layer portion, removing the hard mask layer over the workpiece, depositing a dielectric layer over the workpiece, planarizing the workpiece such that top surfaces of the plurality of first dummy gate stacks, the plurality of second dummy gate stacks, the plurality of third dummy gate stacks, and the plurality of fourth dummy gate stacks, and the dielectric layer are coplanar, and replacing the plurality of first dummy gate stacks, the plurality of second dummy gate stacks, the plurality of third dummy gate stacks, and the plurality of fourth dummy gate stacks with a plurality of first gate structures, a plurality of first isolation gate structures, a plurality of second gate structures, and a plurality of second isolation gate structures, respectively.

In yet another embodiment, a method is provided. The method includes providing a workpiece that includes a first area having a first dummy gate stack density and a second area having second dummy gate stack density greater than the first dummy gate stack density. The method further includes depositing a photoresist (PR) layer over the workpiece to form a first PR layer portion over the first area and a second PR layer portion over the second area, forming a plurality of openings through the second PR layer portion while the first PR layer portion remains intact, and after the forming of the plurality of openings, etching back the PR layer.

In some embodiments, the workpiece includes a plurality of first dummy gate stacks and a plurality of second dummy gate stacks in the second area and the plurality of openings expose a portion of each of the plurality of first dummy gate stacks and each of the plurality of second dummy gate stacks. In some implementations, the forming of the plurality of openings includes use of a photolithography radiation source, a width of each of the plurality of first dummy gate stacks is greater than a wavelength of the photolithography radiation source, and a width of each of the plurality of second dummy gate stacks is substantially equal to a wavelength of the photolithography radiation source. In some embodiments, the first PR layer portion includes a first thickness and the second PR layer portion includes a second thickness greater than the first thickness. In some instances, a difference between the first thickness and the second thickness is between about 100 Å and about 300 Å.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a workpiece including:
   a first dummy gate stack and a second dummy gate stack disposed in a first area of the workpiece,
   a first source/drain feature disposed between the first dummy gate stack and the second dummy gate stack,
   a third dummy gate stack and a fourth dummy gate stack disposed in a second area of the workpiece,
   a second source/drain feature disposed between the third dummy gate stack and the fourth dummy gate stack,
   a hard mask layer disposed over each of the first dummy gate stack, the second dummy gate stack, the third dummy gate stack, and the fourth dummy gate stack;
   depositing a photoresist (PR) layer over the workpiece to form a first PR layer portion over the first area and a second PR layer portion over the second area; and
   selectively forming a first opening through the second PR layer portion over the third dummy gate stack and a second opening through the second PR layer portion over the fourth dummy gate stack,
   wherein the first dummy gate stack, the second dummy gate stack, the third dummy gate stack, and the fourth dummy gate stack comprise polysilicon.

2. The method of claim 1, wherein the first PR layer portion includes a first thickness and the second PR layer portion includes a second thickness greater than the first thickness.

3. The method of claim 1, wherein a difference between a thickness of the first PR layer portion and a thickness of the second PR layer portion is between about 100 Å and about 300 Å.

4. The method of claim 1,
   wherein a first width of the first dummy gate stack is substantially equal to a second width of the second dummy gate stack,
   wherein a third width of the third dummy gate stack is between about 240 nm and 1800 nm.

5. The method of claim 4,
   wherein the selectively forming of the first opening and the second opening comprises use of a lithography radiation source,
   wherein a fourth width of the fourth dummy gate stack is substantially equal to a wavelength of the lithography radiation source.

6. The method of claim 5, wherein the wavelength is about 248 nm.

7. The method of claim 1, further comprising:
   etching back the first PR layer portion and the second PR layer portion;
   removing the hard mask layer;
   depositing a dielectric layer over the workpiece;
   planarizing the workpiece such that top surfaces of the first dummy gate stack, the second dummy gate stack, the third dummy gate stack, and the fourth dummy gate stack, and the dielectric layer are coplanar; and
   replacing the first dummy gate stack, the second dummy gate stack, the third dummy gate stack, and the fourth dummy gate stack with a first gate structure, a first isolation gate structure, a second gate structure, and a second isolation gate structure, respectively.

8. A method, comprising:
   providing a workpiece, the workpiece comprising:
   a plurality of fin structures extending along a first direction over a first area and a second area of the workpiece,
   a plurality of first dummy gate stacks and a plurality of second dummy gate stacks disposed in the first area,
   a plurality of third dummy gate stack and a plurality of fourth dummy gate stacks disposed in the second area,
   a hard mask layer disposed over each of the plurality of first dummy gate stacks, the plurality of second dummy gate stacks, the plurality of third dummy gate stacks, and the plurality of fourth dummy gate stacks;
   depositing a photoresist (PR) layer over the workpiece to form a first PR layer portion over the first area and a second PR layer portion over the second area; and
   selectively forming a plurality of first openings through the second PR layer portion over the plurality of third dummy gate stack and a plurality of second openings through the second PR layer portion over the plurality of fourth dummy gate stacks, while the first PR layer portion remains intact.

9. The method of claim 8,
wherein the plurality of first dummy gate stacks and the plurality of second dummy gate stacks comprise a first dummy gate stack density,
wherein the plurality of third dummy gate stacks and the plurality of fourth dummy gate stacks comprise a second dummy gate stack density greater than the first dummy gate stack density.

10. The method of claim 8, wherein the first PR layer portion includes a first thickness and the second PR layer portion includes a second thickness greater than the first thickness.

11. The method of claim 10, wherein a difference between the first thickness and the second thickness is between about 100 Å and about 300 Å.

12. The method of claim 8,
wherein the plurality of first dummy gate stacks are spaced apart from one another by at least one of the plurality of second dummy gate stacks,
wherein the plurality of third dummy gate stacks are spaced apart from one another by at least one of the plurality of fourth dummy gate stacks.

13. The method of claim 8,
wherein a first width of each of the plurality of third dummy gate stacks is between about 240 nm and 1800 nm,
wherein the selectively forming of the plurality of first openings and the plurality of second openings comprises use of a lithography radiation source,
wherein a second width of the each of the plurality of fourth dummy gate stacks is substantially equal to a wavelength of the lithography radiation source.

14. The method of claim 13, wherein the wavelength is about 248 nm.

15. The method of claim 8, further comprising:
etching back the first PR layer portion and the second PR layer portion;
removing the hard mask layer over the workpiece;
depositing a dielectric layer over the workpiece;
planarizing the workpiece such that top surfaces of the plurality of first dummy gate stacks, the plurality of second dummy gate stacks, the plurality of third dummy gate stacks, and the plurality of fourth dummy gate stacks, and the dielectric layer are coplanar; and
replacing the plurality of first dummy gate stacks, the plurality of second dummy gate stacks, the plurality of third dummy gate stacks, and the plurality of fourth dummy gate stacks with a plurality of first gate structures, a plurality of first isolation gate structures, a plurality of second gate structures, and a plurality of second isolation gate structures, respectively.

16. A method, comprising:
providing a workpiece comprising;
a first area having a first dummy gate stack density, the first area including a plurality of first dummy gate stacks and a plurality of second dummy gate stacks, and
a second area having second dummy gate stack density greater than the first dummy gate stack density, the second area including a plurality of third dummy gate stacks and a plurality of fourth dummy gate stacks;
depositing a photoresist (PR) layer over the workpiece to form a first PR layer portion over the first area and a second PR layer portion over the second area;
forming a plurality of openings through the second PR layer portion while the first PR layer portion remains intact; and
after the forming of the plurality of openings, etching back the PR layer,
wherein a gate length of each of the plurality of third dummy gate stacks is greater than a gate length of each of the plurality of first dummy gate stacks.

17. The method of claim 16,
wherein the plurality of openings expose a portion of each of the plurality of third dummy gate stacks and each of the plurality of fourth dummy gate stacks,
wherein a gate length of each of the plurality of fourth dummy gate stacks is greater than a gate length of each of the plurality of second dummy gate stacks.

18. The method of claim 16,
wherein the forming of the plurality of openings comprises use of a photolithography radiation source,
wherein a width of each of the plurality of first dummy gate stacks is greater than a wavelength of the photolithography radiation source,
wherein a width of each of the plurality of second dummy gate stacks is substantially equal to a wavelength of the photolithography radiation source.

19. The method of claim 16, wherein the first PR layer portion includes a first thickness and the second PR layer portion includes a second thickness greater than the first thickness.

20. The method of claim 19, wherein a difference between the first thickness and the second thickness is between about 100 Å and about 300 Å.

* * * * *